United States Patent
Sekiguchi et al.

(10) Patent No.: US 11,833,720 B2
(45) Date of Patent: Dec. 5, 2023

(54) IMPRINT METHOD, IMPRINT APPARATUS, AND ARTICLE MANUFACTURING METHOD

(71) Applicant: CANON KABUSHIKI KAISHA, Tokyo (JP)

(72) Inventors: Hiroyuki Sekiguchi, Tochigi (JP); Kenichi Kobayashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 136 days.

(21) Appl. No.: 17/239,795

(22) Filed: Apr. 26, 2021

(65) Prior Publication Data

US 2021/0339433 A1 Nov. 4, 2021

(30) Foreign Application Priority Data

May 1, 2020 (JP) .................................. 2020-081502

(51) Int. Cl.
*B29C 35/08* (2006.01)
*B29C 59/02* (2006.01)
(Continued)

(52) U.S. Cl.
CPC ...... *B29C 35/0888* (2013.01); *B29C 35/0288* (2013.01); *B29C 59/02* (2013.01);
(Continued)

(58) Field of Classification Search
CPC . B29C 35/0888; B29C 35/0288; B29C 59/02; B29C 59/16; B29C 2035/0822;
(Continued)

(56) References Cited

U.S. PATENT DOCUMENTS 9,594,301 B2    3/2017  Hayashi
10,663,858 B2 * 5/2020  Hayashi ................ B82Y 10/00
(Continued)

FOREIGN PATENT DOCUMENTS

JP    2013102132 A    5/2013
JP    2016058735 A    4/2016
(Continued)

OTHER PUBLICATIONS

Tamura, 2016, JP2016058735, English Machine Translation.*

*Primary Examiner* — Caleen O Sullivan
(74) *Attorney, Agent, or Firm* — ROSSI, KIMMS & McDOWELL LLP (57) ABSTRACT

An imprint method of molding an imprint material on a shot region of a substrate using a mold, includes aligning the shot region and the mold in a state where the imprint material and a pattern region of the mold are in contact with each other; and curing the imprint material by irradiating the imprint material with curing light after the aligning. The aligning is controlled so as to include an overlap period during which a period during which deformation light used to deform the shot region is applied to the substrate through the imprint material and a period during which polymerization light used to increase a viscosity of the imprint material is applied to the imprint material overlap each other. The polymerization light to be applied to the imprint material is controlled in accordance with the deformation light to be applied to the imprint material during the overlap period.

18 Claims, 9 Drawing Sheets

(51) Int. Cl.
*B29C 35/02* (2006.01)
*B29C 59/16* (2006.01)
*G03F 7/00* (2006.01)
*G03F 7/20* (2006.01)
*G03F 9/00* (2006.01)
*B29L 31/34* (2006.01)

(52) U.S. Cl.
CPC ............ *B29C 59/16* (2013.01); *G03F 7/0002* (2013.01); *G03F 7/2012* (2013.01); *G03F 9/7042* (2013.01); *B29L 2031/34* (2013.01)

(58) Field of Classification Search
CPC .... B29C 2035/0827; B29C 2035/0833; B29C 37/0053; G03F 7/0002; G03F 7/2012; G03F 9/7042; B29L 2031/34
USPC ............................................................ 438/5
See application file for complete search history.

(56) References Cited

U.S. PATENT DOCUMENTS

| 11,584,063 B2* | 2/2023 | Nawata ................... B29C 43/58 |
| 2022/0242013 A1* | 8/2022 | Matsuoka ............... B29C 59/02 |

FOREIGN PATENT DOCUMENTS

| JP | 2019021749 A | 2/2019 |
| JP | 2019067918 A | 4/2019 |

\* cited by examiner

IMPRINT METHOD, IMPRINT APPARATUS, AND ARTICLE MANUFACTURING METHOD

BACKGROUND OF THE INVENTION

Field of the Invention

The present invention relates to an imprint method, an imprint apparatus, and an article manufacturing method.

Description of the Related Art

Japanese Patent Laid-Open No. 2016-058735 describes an imprint method including a step of irradiating an imprint material with light which increases the viscoelasticity of the imprint material, a step of aligning a substrate having the imprint material irradiated with the light and a mold, and a step of applying light that cures the imprint material. Japanese Patent Laid-Open No. 2013-102132 describes an imprint apparatus including a shape correcting mechanism that deforms a pattern region of a mold, a heating mechanism that heats a substrate-side pattern region of a substrate to deform the substrate-side pattern region, and a controller. Based on information concerning a shape difference between the pattern region of the mold and the substrate-side pattern region, the controller controls the shape correcting mechanism and the heating mechanism so as to decrease the shape difference between the pattern region of the mold and the substrate-side pattern region.

In order to increase the throughput while overlaying a shot region of the substrate and the pattern region of the mold with high accuracy, it is effective to deform the shot region using light having a wavelength band which does not cure the imprint material and increase the viscosity of the imprint material during alignment. However, a phenomenon was confirmed that when the imprint material was simultaneously irradiated with the deformation light for deforming the shot region and the polymerization light for increasing the viscosity of the imprint material, the viscosity of the imprint material was increased more than in a case in which the imprint material was irradiated with only the polymerization light. Therefore, if a deformation light irradiation condition and a polymerization light irradiation condition during the alignment are determined independently of each other, the viscosity of the imprint material becomes higher than a target viscosity, and this can cause a decrease in overlay accuracy or a decrease in throughput due to a long time required for alignment.

SUMMARY OF THE INVENTION

The present invention provides a technique advantageous in improving the overlay accuracy and the throughput.

One of aspects of the present invention provides an imprint method of molding an imprint material on a shot region of a substrate using a mold, the method comprising: aligning the shot region and the mold in a state where the imprint material and a pattern region of the mold are in contact with each other; and curing the imprint material by irradiating the imprint material with curing light after the aligning, wherein the aligning is controlled so as to include an overlap period during which a period during which deformation light used to deform the shot region is applied to the substrate through the imprint material and a period during which polymerization light used to increase a viscosity of the imprint material is applied to the imprint material overlap each other, and the polymerization light to be applied to the imprint material is controlled in accordance with the deformation light to be applied to the imprint material during the overlap period.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1:
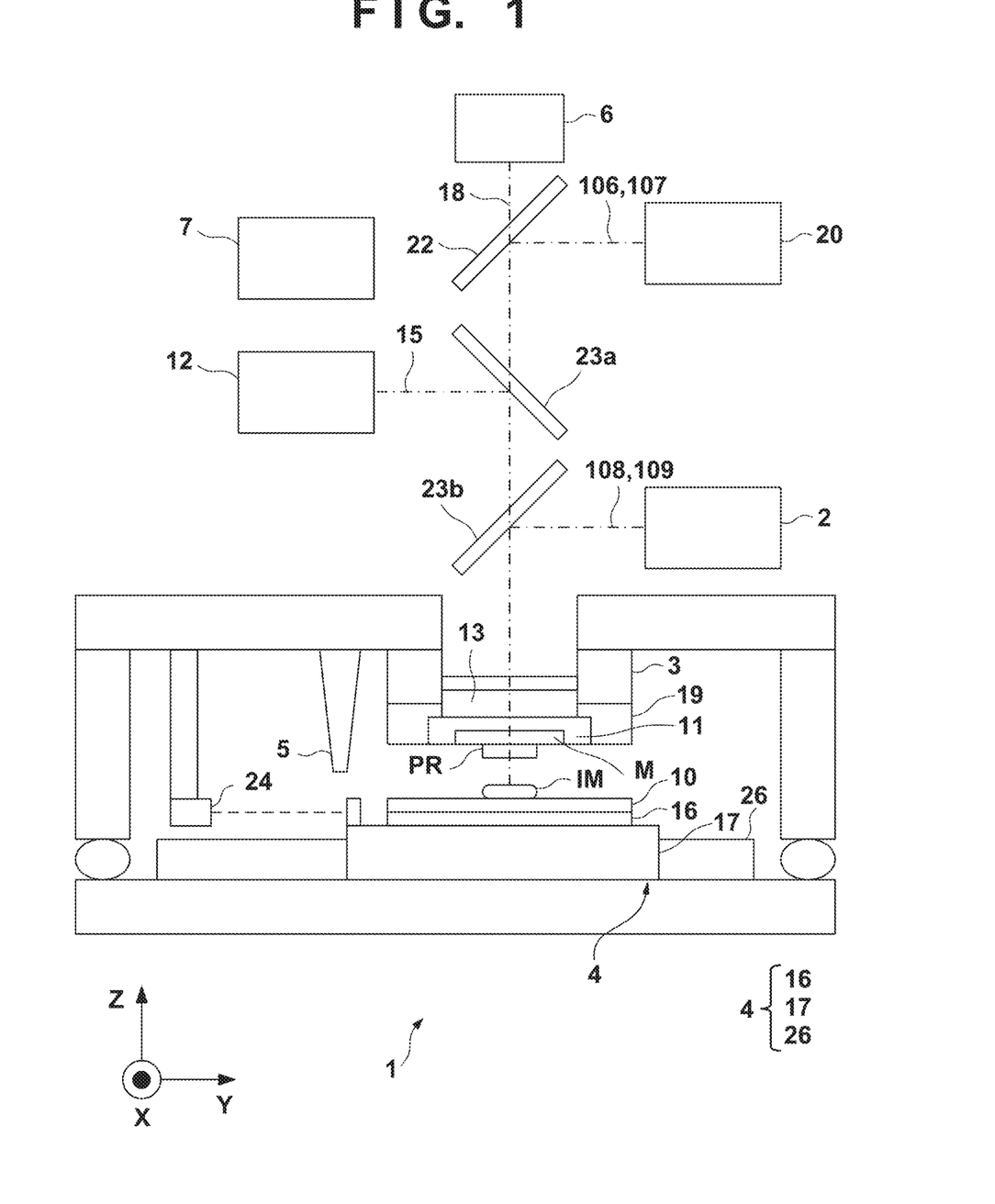
FIG. 1 is a view showing the arrangement of an imprint apparatus according to an embodiment.

FIG. 1 schematically shows the arrangement of an imprint apparatus 1 according to an embodiment. The imprint apparatus 1 can bring an imprint material IM on a shot region of a substrate 10 into contact with a mold M, perform alignment between the shot region and the mold M, and cure the imprint material IM by irradiating the imprint material IM with curing light. Thus, a pattern formed of a cured product of the imprint material IM can be formed on the shot region of the substrate 10. Then, the imprint apparatus 1 can separate the mold M from the pattern formed of the cured product of the imprint material IM. The imprint apparatus 1 may be understood as an apparatus that executes an imprint method of molding the imprint material IM on the shot region of the substrate 10 using the mold M. The mold M can be also referred to as a template or an original. The imprint apparatus 1 can be used for manufacturing an article, for example, a device such as a semiconductor device.

The imprint apparatus 1 can include a mold driving mechanism 3 (imprint head) that holds and drives the mold M, a substrate driving mechanism 4 that holds and drives the substrate 10, and a supplier 5 (dispenser) that supplies the imprint material IM onto the substrate 10. The imprint apparatus 1 can also include an exposure device (first irradiator) 2 that irradiates the imprint material IM with polymerization light 108 which increases the viscosity of the imprint material IM or curing light 109 which cures the imprint material IM. The imprint apparatus 1 can further include an image capturing device 6 that irradiates the substrate 10, the imprint material IM, and the mold M with illumination light 18 and performs image capturing for checking, for example, the contact state between the mold M and the imprint material IM and the presence/absence of a foreign substance. The imprint apparatus 1 can also include a controller 7 that controls an operation of the imprint apparatus 1. The imprint apparatus 1 can further include a detector 12 that detects an alignment mark of the mold M and an alignment mark of the substrate 10. The detector 12 can include an illumination device (not shown) used to irradiate the alignment mark with detection light 15 for illuminating the alignment mark, and an image capturing device (not shown) that captures the alignment mark.

The substrate driving mechanism 4 can include a substrate chuck 16 that holds the substrate 10, a substrate stage 17 that supports the substrate chuck 16, and a substrate stage driving device 26 that drives the substrate stage 17. The imprint apparatus 1 can include a detection system 24 (for example, an interferometer or an encoder) that detects the position of the substrate stage 17. The position of the substrate 10 can be controlled by controlling the position of the substrate stage 17 based on a detection result of the detection system 24.

The mold driving mechanism 3 can include a mold chuck 11 used to hold the mold M, and a mold chuck driving device 19 (actuator) that drives the mold chuck 11. The mold driving mechanism 3 can perform a contact operation of bringing a pattern region PR of the mold M into contact with the imprint material IM on a shot region of the substrate 10, and a mold releasing operation which is performed after the imprint material IM is cured. The mold driving mechanism 3 can include a closed space 13 on the back surface side (the opposite side of the pattern region PR) of the mold M. The mold driving mechanism 3 can further include a pressure controller (not shown) that controls the shape of the pattern region PR by controlling the pressure in the closed space 13. In the contact operation and the mold releasing operation, the pressure controller can deform the mold M or the pattern region PR into a convex shape toward the substrate 10 by making the pressure in the closed space 13 positive.

The imprint apparatus 1 can include an illuminance distribution forming device (second irradiator) 20. The illuminance distribution forming device 20 can include a device, for example, a DMD (Digital Mirror Device) that controls the illuminance distribution of light applied to the imprint material IM or the substrate 10. The illuminance distribution forming device 20 can irradiate the substrate 10, through the imprint material IM, with deformation light 107 whose illuminance distribution has been controlled so as to deform the shot region of the substrate 10 into a target shape. By irradiation of the deformation light 107, the temperature distribution according to the illuminance distribution (light amount distribution) of the deformation light 107 is formed in the substrate 10, and this can deform the shot region of the substrate 10. Further, the illuminance distribution forming device 20 can irradiate the imprint material IM with polymerization light 106 whose illuminance distribution has been controlled so as to cause the imprint material IM to have a target viscosity distribution. Here, the deformation light 107 and the polymerization light 106 can be light beams having wavelength bands different from each other. The deformation light 107 can have a wavelength band that causes no photopolymerization reaction of the imprint material IM when the imprint material IM is irradiated with only the deformation light 107. The polymerization light 106 can have a wavelength band that causes a photopolymerization reaction of the imprint material IM when the imprint material IM is irradiated with the polymerization light 106.

Irradiation of the polymerization light 106 to the imprint material IM can be performed in alignment between the shot region of the substrate 10 and the pattern region PR of the mold M which is performed in a state where the imprint material IM on the shot region of the substrate 10 and the pattern region PR of the mold M are in contact with each other. By irradiation of the polymerization light 106 to the imprint material IM, the bonding strength between the substrate 10 and the mold M generated by the imprint material IM is increased, so that relative vibration between the substrate 10 and the mold M can be suppressed. Accordingly, a time required for alignment between the shot region of the substrate 10 and the pattern region PR of the mold M can be shortened. This can contribute to an improvement in throughput.

In an example, the illuminance distribution forming device 20 can selectively emit one of the deformation light 107 and the polymerization light 106 toward the substrate 10 in accordance with an instruction from the controller 7. In parallel with the alignment between the shot region of the substrate 10 and the pattern region PR of the mold M, filling of the imprint material IM into a space between the shot region of the substrate 10 and the pattern region PR of the mold M and filling of the imprint material IM into a concave portion of the pattern region PR can be performed.

The imprint apparatus 1 can include the exposure device (first irradiator) 2 that irradiates the imprint material IM with the polymerization light 108 or the curing light 109 which causes a photopolymerization reaction of the imprint material IM. The polymerization light 108 can be light which is applied to the imprint material IM in an alignment step, and the curing light 109 can be light which is applied to the imprint material IM in a curing step after the alignment step. The wavelength bands of the polymerization light 108 and the curing light 109 may be the same or different from each other. Note that both the polymerization light and the curing light are exposure light beams each of which increases the degree of polymerization of the imprint material IM. However, in this specification, in order to distinguish them, the exposure light to be used during the alignment is referred to as the polymerization light, and the exposure light to be used after the alignment is referred to as the curing light.

A combining mirror 22 combines the illumination light 18 and the deformation light 107 or the polymerization light 106 and radiates the combined light toward the substrate 10. A dichroic mirror 23a transmits the illumination light 18, the deformation light 107, and the polymerization light 106, and reflects the detection light 15. A dichroic mirror 23b transmits light from the dichroic mirror 23a, and reflects the polymerization light 108 and the curing light 109. The detector 12 is used to detect the relative position between the alignment mark of the mold M and the alignment mark of the substrate 10. The controller 7 can detect an alignment error between the shot region of the substrate 10 and the pattern region PR of the mold M based on (a plurality of) relative positions, each of which is obtained between the alignment mark of the mold M and the alignment mark of the substrate 10, detected using the detector 12. Based on the alignment error, the controller 7 can decrease the alignment error (that is, perform alignment between the shot region and the pattern region PR) by controlling at least one of the substrate driving mechanism 4 and the mold driving mechanism 3.

The controller 7 can be configured to control the mold driving mechanism 3, the substrate driving mechanism 4, the supplier 5, the exposure device 2, the detector 12, the illuminance distribution forming device 20, and the image capturing device 6. The controller 7 can be formed from, for example, a PLD (an abbreviation for Programmable Logic Device) such as an FPGA (an abbreviation for Field Programmable Gate Array), an ASIC (an abbreviation for Application Specific Integrated Circuit), a general-purpose or dedicated computer installed with a program, or a combination of all or some of these components.

As the imprint material IM, a curable composition (to be also referred to a resin in an uncured state) to be cured by light irradiation is used. The light can be, for example, infrared light, a visible light beam, or ultraviolet light, or the like selected from the wavelength range of 10 nm (inclusive) to 1 mm (inclusive). The curable composition to be cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like. The imprint material IM is applied in a film shape onto the substrate by a spin coater or a slit coater. Alternatively, the imprint material IM may be applied, onto the substrate 10, in a droplet shape or in an island or film shape formed by connecting a plurality of droplets using a liquid injection head. The viscosity (the viscosity at 25° C.) of the imprint material IM can be, for example, 1 mPa·s (inclusive) to 100 mPa·s (inclusive). As the substrate 10, glass, a ceramic, a metal, a semiconductor, a resin, or the like can be used. A member made of a material different from the substrate 10 may be formed on the surface of the substrate 10, as needed. The substrate 10 can be, for example, a silicon wafer, a compound semiconductor wafer, silica glass, or the like.

Figure 2A:
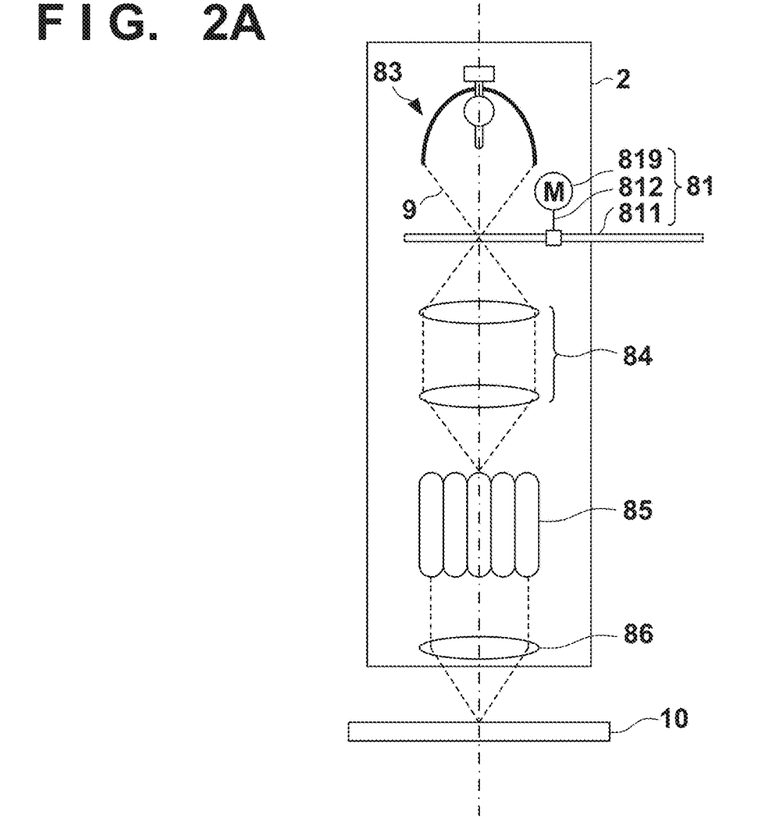
FIGS. 2A and 2B are views illustrating the arrangement of an exposure device of the imprint apparatus shown in FIG. 1.
Figure 2B:
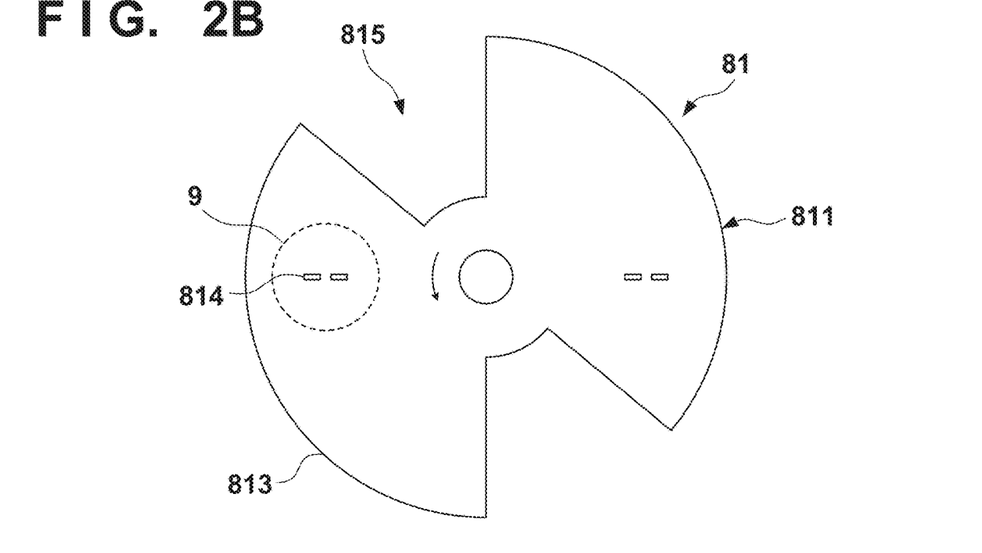

FIGS. 2A and 2B show an arrangement example of the exposure device 2. The exposure device 2 can include, for example, a light source 83, a shutter mechanism 81, an imaging optical system 84, a fly-eye lens 85, and an imaging optical system 86. The light source 83 can be, for example, a lamp such as a mercury lamp, or a solid-state light source such as a laser or an LED. The shutter mechanism 81 can include a shutter plate 811, and an actuator 819 that drives the shutter plate 811. For example, the actuator 819 can be configured so as to cause the shutter plate 811 to pivot, but may be configured so as to drive (reciprocate) the shutter plate 811 in one axial direction.

An intermediate image of the light source 83 can be formed on a plane where the shutter plate 811 is arranged. The imaging optical system 84 can be configured such that the plane where the shutter plate 811 is arranged and the incident plane of the fly-eye lens 85 optically have a conjugate positional relationship. The imaging optical system 86 can be configured such that the incident plane of the fly-eye lens 85 and the substrate 10 optically have a conjugate positional relationship. The shutter plate 811 is connected to the actuator 819 via a driving shaft 812, and can be caused to pivot by the actuator 819. The dotted line in FIG. 2B indicates a region (light path) where exposure light 9 from the light source 83 enters. The shutter plate 811 can include a shielding portion 813 that shields the exposure light 9 from the light source 83. The shutter plate 811 can also include a first passing portion 814 used to irradiate, with the polymerization light 108, a portion of the entire imprint material IM on the shot region so as to increase the viscosity of the portion (preliminary exposure). In this example, the exposure light 9 that passes through the first passing portion 814 is the polymerization light 108. Further, the shutter plate 811 can include a second passing portion 815 used to irradiate the entire imprint material IM on the shot region with the curing light 109. In this example, the exposure light 9 that passes through the second passing portion 815 is the curing light 109. The shutter plate 811 has a two-fold symmetrical structure in the example shown in FIG. 2B, but it may have another structure.

In this example, by not shielding the exposure light 9 from the light source 83, the curing light 109 for curing the imprint material IM after the alignment is generated. Further, by partially shielding the exposure light 9 from the light source 83, the polymerization light 108 for increasing the viscosity of the imprint material IM during the alignment is generated. However, a light source that generates the curing light and a light source that generates the polymerization light may be separately provided.

In an example, the polymerization light 108 which passes through the first passing portion 814 can have an intensity higher than that of the polymerization light 106 from the illuminance distribution forming device 20. This is advantageous in causing a polymerization reaction of the imprint material IM in a shorter time to increase the viscosity. On the other hand, in order to adjust the viscosity of the imprint material IM to a target viscosity with high accuracy, it is advantageous to use the polymerization light 106 from the illuminance distribution firming device 20 whose intensity is lower than that of the polymerization light 108 which passes through the first passing portion 814. Therefore, the polymerization light 108 which passes through the first passing portion 814 can be first applied to the imprint material IM, and then, the polymerization light 106 from the illuminance distribution forming device 20 can be applied to the imprint material IM. However, there may be a period during which the imprint material IM is irradiated with both the polymerization light 108 which passes through the first passing portion 814 and the polymerization light 106 from the illuminance distribution forming device 20.

Figure 8:
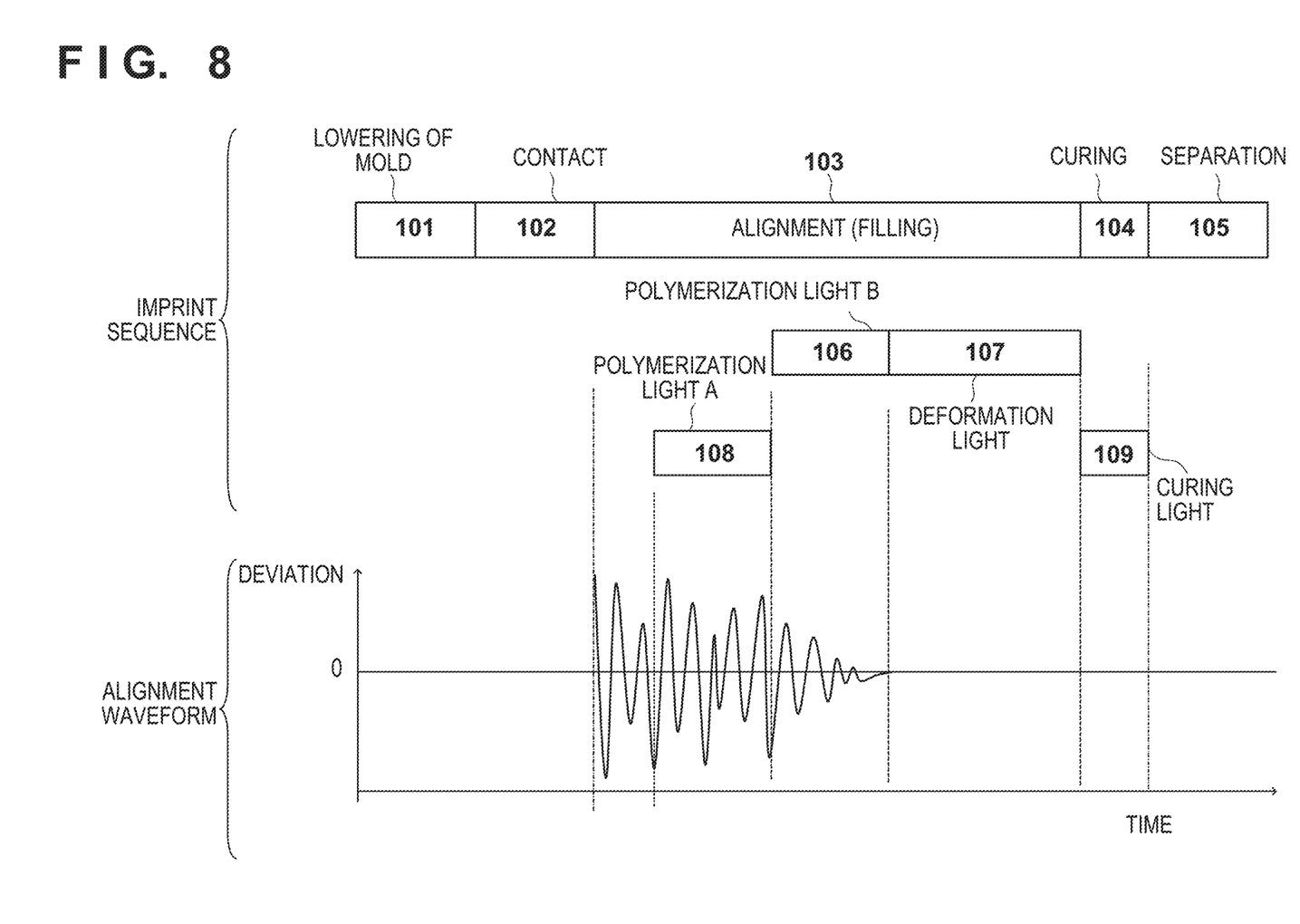
FIG. 8 is a view showing a comparative example.

FIG. 8 shows a comparative example of light irradiation to the imprint material IM in an imprint sequence. The polymerization light (B) 106 and the deformation light 107 are generated by the illuminance distribution forming device 20. The polymerization light (A) 108 and the curing light 109 are generated by the exposure device 2. The imprint sequence in which a pattern formed of a cured product of the imprint material can include, for example, a lowering step 101, a contact step 102, an alignment step 103, a curing step 104, and a separation step 105. In the lowering step 101, the controller 7 operates the mold driving mechanism 3 so as to lower the mold M to a predetermined height. In the contact step 102, the controller 7 operates the mold driving mechanism 3 so as to further lower the mold M and bring the imprint material IM on the shot region into contact with the pattern region PR of the mold M. By contact between the imprint material IM and the pattern region PR of the mold M, filling of the imprint material IM is started. The filling of the imprint material IM can include filling of the imprint material IM into a space between the shot region of the substrate 10 and the pattern region PR of the mold M and filling of the imprint material IM into a concave portion of the pattern region PR.

In the alignment step 103, the controller 7 performs alignment between the shot region of the substrate 10 and the pattern region PR of the mold M. The alignment can include decreasing a relative position error and a relative rotation error between the shot region and the pattern region PR and decreasing a shape difference between the shot region and the pattern region PR. The former can be performed by operating, based on an alignment error detected using the detector 12, at least one of the substrate driving mechanism 4 and the mold driving mechanism 3 by the controller 7 so as to decrease the alignment error. The latter can be performed by controlling, by the controller 7, the deformation light 107 generated by the illuminance distribution forming device 20 so as to decrease the shape difference between the shot region and the pattern region PR. The shape difference between the shot region and the pattern region PR may be measured in real time using the detector 12, or may be measured in advance.

In the curing step 104, the controller 7 cures the imprint material IM by controlling the exposure device 2 such that the imprint material IM is irradiated with the curing light 109 in a state where the imprint material IM and the mold M are in contact with each other. In the separation step 105, the controller 7 operates the mold driving mechanism 3 so as to separate the mold M from the pattern formed of a cured product of the imprint material IM.

After the alignment step 103 is started, the controller 7 operates the exposure device 2 so as to apply the polymerization light (A) 108 to the imprint material IM. With this operation, the imprint material IM can be changed to a state where the viscosity thereof is easily changed. After that, in the alignment step 103, the controller 7 operates the illuminance distribution forming device 20 so as to apply the polymerization light (B) 106 to the imprint material IM. With this operation, the viscosity of the imprint material IM is increased to the target viscosity. Thereafter, in the alignment step 103, the controller 7 operates the illuminance distribution forming device 20 so as to apply the deformation light 107 to the substrate 10 via the imprint material IM. With this operation, the shot region of the substrate 10 can be deformed into a target shape. Then, in the curing step 104, the controller 7 operates the exposure device 2 so as to apply the curing light 109 to the imprint material IM. With this operation, the imprint material IM is cured. After that, in the separation step 105, the mold M is separated from a pattern formed of a cured product of the imprint material IM.

In FIG. 8, the alignment waveform represents one component (for example, an X- or Y-direction deviation) of the alignment error between the shot region of the substrate 10 and the pattern region PR of the mold M. The viscosity of the imprint material IM is increased by irradiation of the polymerization light (B) 106 to the imprint material IM performed by the illuminance distribution forming device 20, and the alignment error slightly changes accordingly. Thereafter, the illuminance distribution forming device 20 changes the light applied to the imprint material IM from the polymerization light (B) 106 to the deformation light 107 to deform the shot region into the target shape.

Figure 3:
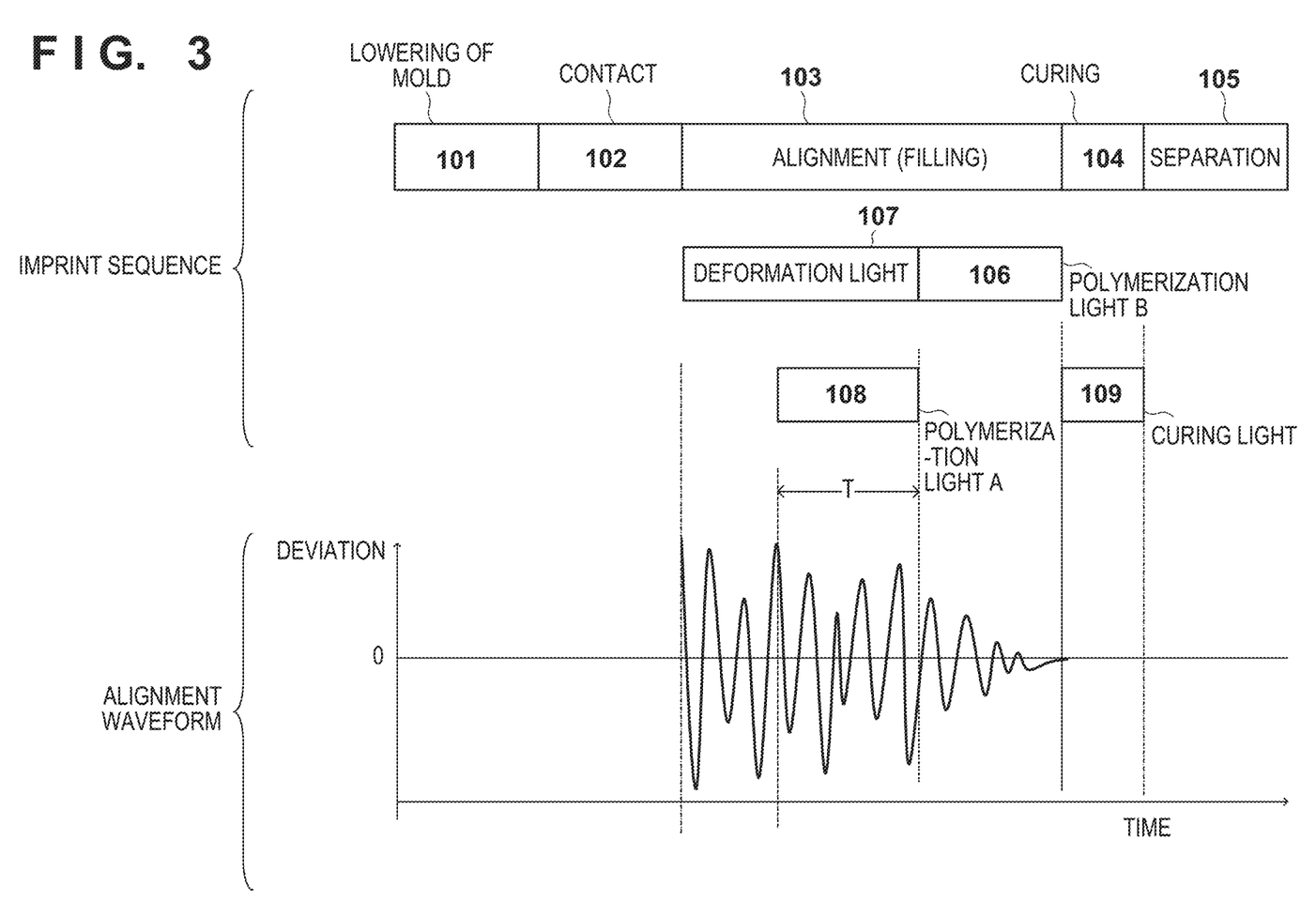
FIG. 3 is a view showing an imprint sequence according to the embodiment.

FIG. 3 shows an embodiment of light irradiation to the imprint material IM in the imprint sequence. The embodiment shown in FIG. 3 can follow the comparative example unless otherwise specified. In this embodiment, the alignment step 103 can be controlled by the controller 7 so as to include an overlap period T during which a period during which the deformation light 107 is applied to the substrate 10 through the imprint material IM and a period during which the polymerization light (A) 108 is applied to the imprint material IM overlap each other. The polymerization light (A) 108 and the polymerization light (B) 106 to be applied to the imprint material IM can be controlled by the controller 7 in accordance with the deformation light 107 to be applied to the imprint material IM during the overlap period T.

Existence of the overlap period T means that the whole or a part of the period during which the deformation light 107 is applied to the imprint material IM by the illuminance distribution forming device 20 overlaps the whole or a part of the period during which the polymerization light (B) 108 is applied to the imprint material IM by the exposure device 2. By providing the overlap period T, a time required for the alignment is shortened, and this can result in an improvement of the throughput. The illuminance distribution forming device 20 may apply the polymerization light (B) 106 to the imprint material IM after applying the deformation light 107 to the substrate 10 via the imprint material IM.

Here, the deformation light 107 applied to the imprint material IM by the illuminance distribution forming device 20 does not change the viscosity (degree of polymerization) of the imprint material IM when the imprint material IM is irradiated with only the deformation light 107. However, it was confirmed by an experiment that when the imprint material IM was irradiated with the deformation light 107 and the polymerization light (A) 108, the viscosity (degree of polymerization) of the imprint material IM was increased more than in a case in which the imprint material IM was irradiated with only the polymerization light (A) 108.

The reason for this will be described while letting X be the wavelength of the deformation light 107 and Y be the wavelength of the polymerization light (A) 108. The photopolymerization initiator of the imprint material IM cannot start photopolymerization by irradiation of only the deformation light 107 having the wavelength X. However, if the photopolymerization initiator excited by the polymerization light (A) 108 having the wavelength Y has a characteristic of absorbing light having the wavelength X, the speed of photopolymerization is increased by irradiation of light including the wavelength X and the wavelength Y more than in the case of irradiation of only the deformation light 107 having the wavelength X.

Figure 4:
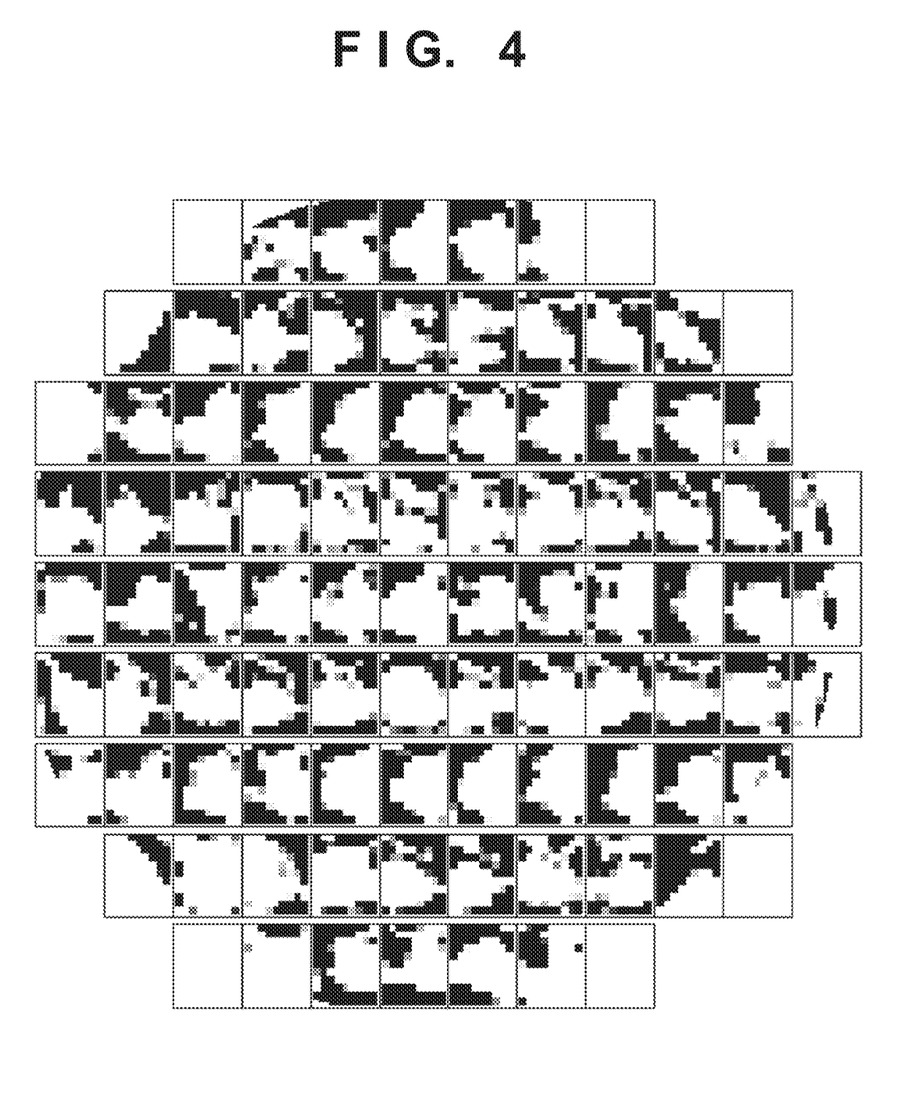
FIG. 4 is a view illustrating the illuminance distribution (light amount distribution) of deformation light to be applied to a substrate.

Promoting the change in viscosity of the imprint material IM by irradiation of the deformation light 107 can influence convergence of relative vibration between the shot region and the pattern region during the alignment. FIG. 4 illustrate the illuminance distribution (light amount distribution) of the deformation light 107 to be applied to the substrate 10. Here, each rectangle indicates the shot region. In order to minimize the alignment error in each shot region, the illuminance distribution (light amount distribution) of the deformation light 107 can be determined for each shot region. The illuminance distribution (light amount distribution) of the deformation light 107 for each shot region can be determined in accordance with the shape of the shot region. The shape of each shot region can depend on the design of a device to be manufactured, a manufacturing process, and the like.

As has been described above, promoting the change in viscosity of the imprint material IM by irradiation of the deformation light 107 can influence convergence of relative vibration between the shot region and the pattern region during the alignment. Therefore, in this embodiment, the controller 7 is configured to control the polymerization light (A) 108 and the polymerization light (B) 106 to be applied to the imprint material IM in accordance with the deformation light 107 to be applied to the imprint material IM during the overlap period T. Such control can be individually performed for each shot region. That is, control of the deformation light 107 can be changed for each shot region, so that control of the polymerization light (A) 108 and the polymerization light (B) 106 can be changed accordingly for each shot region.

Figure 5:
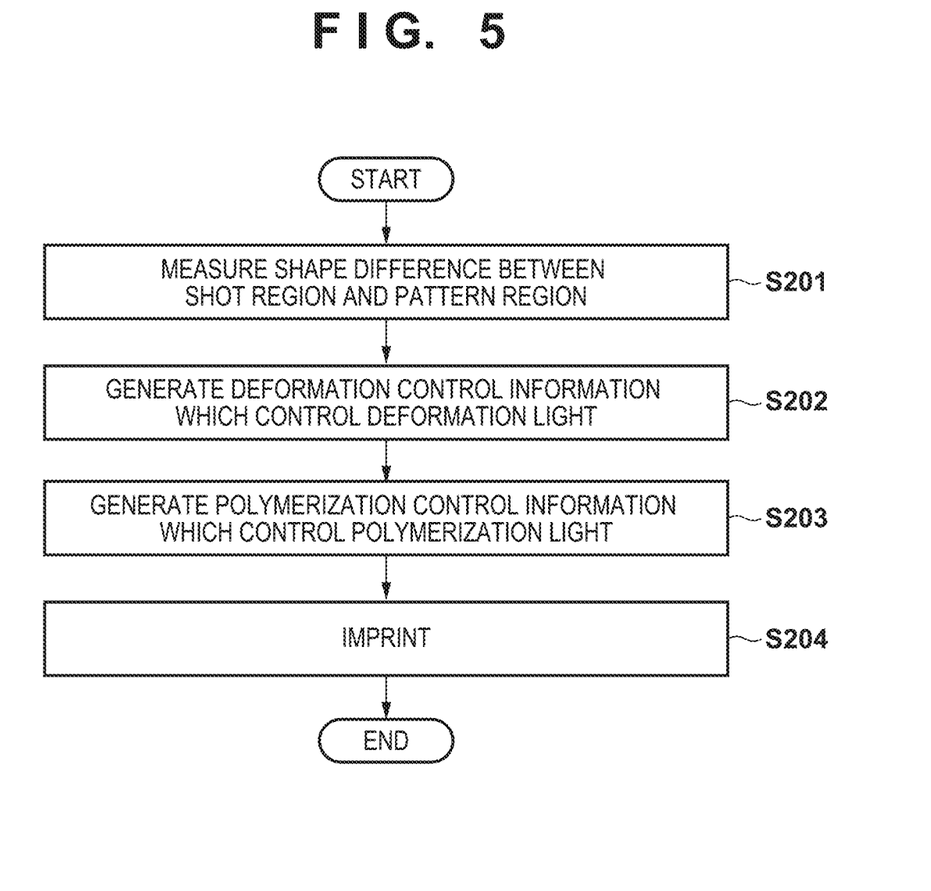
FIG. 5 is a flowchart illustrating a pattern forming method according to the embodiment.

FIG. 5 illustrates a pattern forming method according to the embodiment. In step S201, the shape difference between the shot region of the substrate 10 and the pattern region of the mold M is measured. Step S201 can include, for example, transferring the pattern region PR onto the shot region of the substrate 10 using the mold M by the imprint apparatus 1, and measuring the shape difference between the shot region and the transferred pattern region by an overlay inspection apparatus or the like. Step S201 may include bringing the pattern region PR of the mold M into contact with the imprint material IM on the shot region of the substrate 10 in the imprint apparatus 1 and detecting the relative position between the alignment mark of the mold M and the alignment mark of the substrate 10 using the detector 12. The method using the detector 12 may be performed in the alignment step when manufacturing an article such as a device by the imprint apparatus 1, or may be performed using a test substrate before manufacturing an article.

In step S202 (first generation step), deformation control information used to control the deformation light 107 is generated based on the shape difference obtained in step S201. The deformation control information can include information used to control at least one of the illuminance distribution, the irradiation area, and the irradiation time of the deformation light 107. The deformation control information can be information used to control the shape of the shot region so as to make the alignment error between the shot region and the pattern region PR fall within a target accuracy range. Step S202 may be performed by the controller 7, or may be performed by a computer or the like outside the imprint apparatus 1. In step S203 (second generation step), polymerization control information used to control irradiation of the polymerization light (A) 108 and the polymerization light (B) 106 to the imprint material IM is generated based on the deformation control information generated in step S202. Step S203 may be performed by the controller 7, or may be performed by a computer or the like outside the imprint apparatus 1. The polymerization control information can be generated so as to include the overlap period T during which a period during which the deformation light 107 is applied to the substrate 10 through the imprint material IM and a period during which the polymerization light (A) 108 is applied to the imprint material IM overlap each other.

In an example, in step S203 (second generation step), the polymerization control information can be generated based on a value obtained in the shot region by averaging the light amounts of the deformation light 107 to be applied to the shot region during the overlap period T. In another example, in step S203 (second generation step), the polymerization control information can be generated by correcting, based on the deformation control information, reference information set in advance to control the polymerization light (A) 108 and the polymerization light (B) 106. The illuminance of the polymerization light (A) 108 to be applied to the imprint material IM during the overlap period T can be determined in accordance with the deformation control information. The overlap period T can be determined in accordance with the deformation control information. The polymerization control information can be information used to control irradiation of the polymerization light (A) 108 and the polymerization light (B) 106 such that the viscosity of the imprint material IM reaches the target viscosity. In step S204, the imprint sequence as illustrated in FIG. 3 is performed on each shot region of the substrate 10 in the imprint apparatus 1. Thus, a pattern formed of a cured product of the imprint material is formed in each shot region of the substrate 10.

Figure 6:
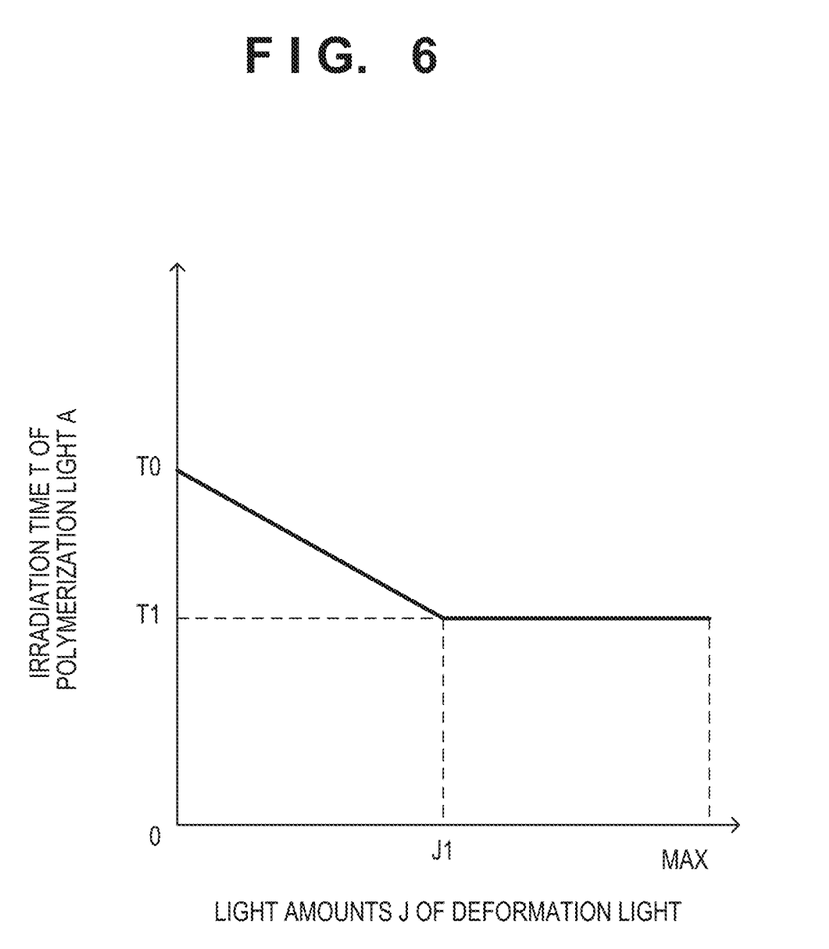
FIG. 6 is a graph for illustrating a polymerization control information generating method.

With reference to FIG. 6, a polymerization control information generation method in step S203 will be described. Here, an example will be described in which the irradiation conditions (for example, the illuminance distribution and the irradiation time) of the polymerization light (B) 106 are fixed conditions, and the irradiation time (overlap period T) serving as one example of the irradiation condition of the polymerization light (A) 108 is determined. The irradiation time (overlap period T) of the polymerization light (A) 108 can be determined in accordance with the deformation light 107 (for example, a light amount J of the deformation light 107) to be applied to the imprint material IM during the overlap period T. Accordingly, the viscosity of the imprint material IM after irradiation of the polymerization light (A) 108 and the polymerization light (B) 106 can be made constant among a plurality of shot regions or a plurality of substrates 10, and the convergence state of relative vibration between the substrate 10 and the mold M can be stabilized.

In FIG. 6, the abscissa represents the average value of the light amounts J of the deformation light 107 in the shot region, and the ordinate represents the irradiation time (overlap time T) of the polymerization light (A) 108. Let T0 be the optimal irradiation time T of the polymerization light (A) 108 when there is no irradiation of the deformation light 107, that is, for J=0. As the light amount J of the deformation light 107 increases, the change (increase) in viscosity of the imprint material IM caused by the polymerization light (A) 108 is increased, so that it is necessary to decrease the irradiation time T. The viscosity of the imprint material IM is changed in accordance with the light amount J of the deformation light 107 until the light amount J reaches the light amount J1, and the viscosity is not further changed with the light amount equal to or larger than the light amount J1. In this case, T=T1 holds. This is expressed as equation (1):

$$T = \begin{cases} T0 - \alpha J, & J < J1 \\ T1, & J \geq J1 \end{cases} \quad (1)$$

A coefficient $\alpha$ can be determined in advance by an experiment.

Figure 7:
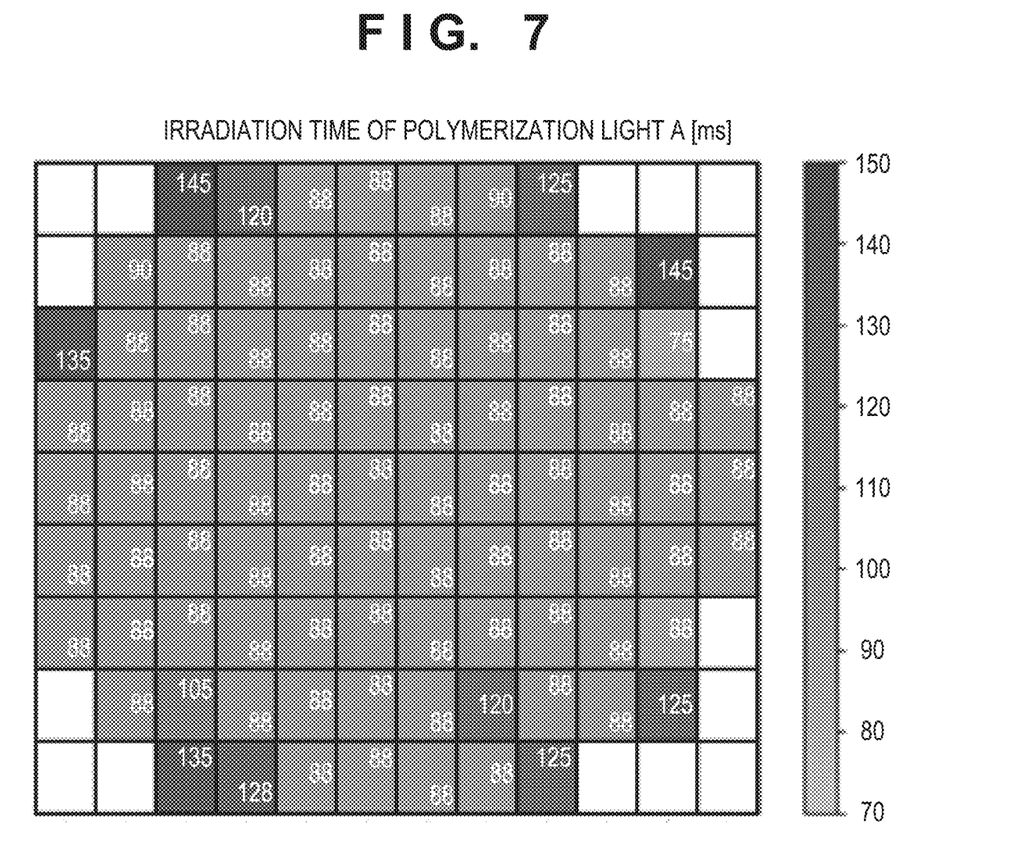
FIG. 7 is a view illustrating the irradiation time of polymerization light.

FIG. 4 illustrates the illuminance distribution of the deformation light 107 determined so as to decrease the shape difference between each shot region of the substrate 10 and the pattern region PR of the mold M. The darker the black, the higher the illuminance (light amount). Note that the light amount is a value obtained by integrating the illuminance with the irradiation time. If the illuminance is constant, the light amount is proportional to the illuminance. FIG. 7 shows a result obtained by calculating the irradiation time (overlap time T) of the polymerization light (A) 108 according to equation (1) based on the illuminance distribution (deformation control information) illustrated in FIG. 4. It can be seen that the lower the illuminance (light amount) of the deformation light 107 in the shot region, the longer the irradiation time of the polymerization light (A) 108 (as a result, the longer the irradiation time of the polymerization light A and the polymerization light B) therein.

In the example described above, the irradiation time (overlap period T) of the polymerization light (A) 108 is adjusted or determined based on the illuminance (light amount) of the deformation light 107, but the illuminance of the polymerization light (A) 108 may be adjusted or determined based on the illuminance (light amount) of the deformation light 107. Alternatively, instead of adjusting the irradiation time and/or the illuminance of the polymerization light (A) 108, the irradiation time and/or the illuminance of the polymerization light (B) 106 may be adjusted. Irradiation of the polymerization light (B) 106 is not necessarily required.

Further, in the example described above, the polymerization control information is generated based on the average value of the illuminances or the light amounts of the deformation light 107 in the shot region, but the polymerization control information can be generated based on information used to control at least one of the illuminance distribution, the irradiation area, and the irradiation time of the deformation light 107. For example, in the shot region, the change in viscosity of the imprint material is larger in a portion which is irradiated with the deformation light 107 than in a region which is not irradiated with the deformation light 107. Accordingly, in the portion where the illuminance is high in the illuminance distribution of the deformation light 107, the intensity of the polymerization light A and/or the polymerization light B can be decreased. Thus, the fillability of the imprint material can be made uniform in the shot region.

Reference polymerization control information defining the polymerization light irradiation conditions adapted to reference deformation control information defining the illuminance distribution serving as a reference may be set in advance, and the polymerization control information may be generated by correcting the reference polymerization control information based on a difference between the reference deformation control information and the deformation control information, or the like.

As has been described above, according to this embodiment, it is possible to provide the overlap period during which the period during which the deformation light is applied to the substrate through the imprint material and the period during which the polymerization light is applied to the imprint material overlap each other. Further, the polymerization light to be applied to the imprint material can be controlled in accordance with the deformation light to be applied to the imprint material during the overlap period. Therefore, the overlay accuracy and the throughput can be improved.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 9A:
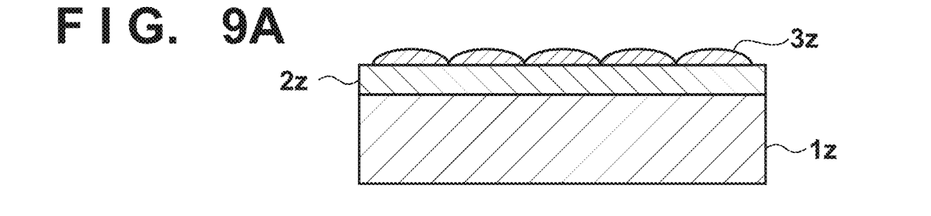
FIGS. 9A to 9F are views illustrating an article manufacturing method.

An article manufacturing method in which an imprint apparatus forms a pattern on a substrate, processes the substrate on which the pattern is formed, and manufactures an article from the processed substrate will be described next. As shown FIG. 9A, a substrate 1z such as a silicon wafer with a processed material 2z such as an insulator formed on the surface is prepared. Next, an imprint material 3z is applied to the surface of the processed material 2z by an inkjet method or the like. A state where the imprint material 3z is applied as a plurality of droplets onto the substrate is shown here.

Figure 9B:
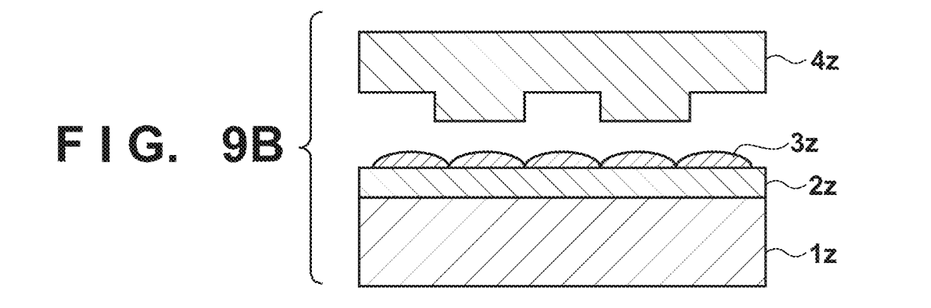
Figure 9C:
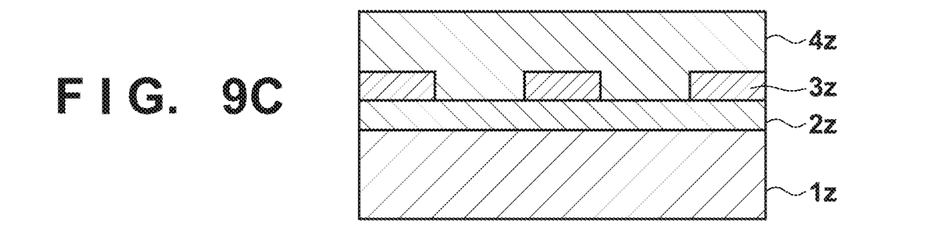

As shown in FIG. 9B, a side of a mold 4z for imprint with a concave-convex pattern is directed toward and made to face the imprint material 3z on the substrate. As shown FIG. 9C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 9D:
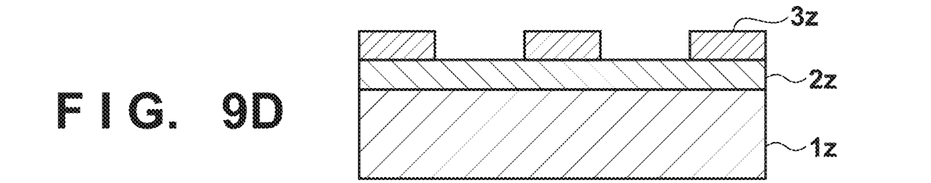

As shown in FIG. 9D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 9E:
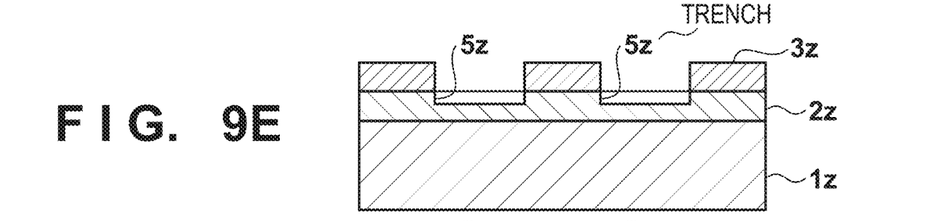
Figure 9F:
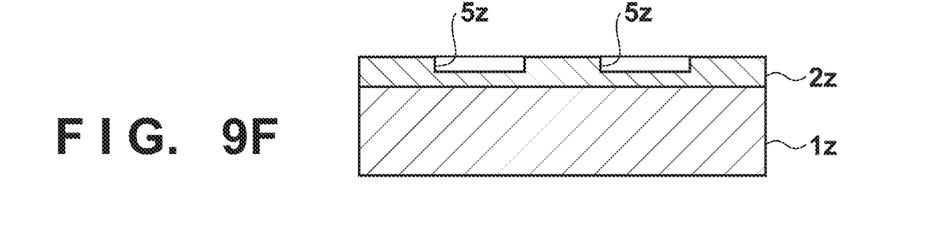

As shown in FIG. 9E, when etching is performed using the pattern of the cured product as an etching resistant mask, a portion of the surface of the processed material 2z where the cured product does not exist or remains thin is removed to form a groove 5z. As shown in FIG. 9F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-081502, filed May 1, 2020, which is hereby incorporated by reference herein in its entirety.

What is claimed is:

1. An imprint method of molding an imprint material on a shot region of a substrate using a mold, the method comprising:
   aligning the shot region and the mold in a state where the imprint material and a pattern region of the mold are in contact with each other; and
   curing the imprint material by irradiating the imprint material with curing light after the aligning,
   wherein the aligning is controlled so as to include an overlap period during which a period during which deformation light used to deform the shot region is applied to the substrate through the imprint material and a period during which polymerization light used to increase a viscosity of the imprint material is applied to the imprint material overlap each other, and
   light amount of the polymerization light to be applied to the imprint material is controlled in accordance with light amount of the deformation light to be applied to the imprint material during the overlap period.

2. The method according to claim 1, wherein a wavelength band of the curing light and a wavelength band of the deformation light are different from each other.

3. The method according to claim 2, wherein in a case where both the deformation light and the polymerization light are applied to the imprint material, the viscosity of the imprint material is increased more than in a case in which only the polymerization light out of the deformation light and the polymerization light is applied to the imprint material.

4. The method according to claim 1, further comprising:
   generating deformation control information used to control irradiation of the deformation light to the substrate; and
   generating, based on the deformation control information, polymerization control information used to control irradiation of the polymerization light to the imprint material.

5. The method according to claim 4, wherein in the generating the polymerization control information, the polymerization control information is generated by correcting, based on the deformation control information, reference information set in advance to control the polymerization light.

6. The method according to claim 4, wherein an illuminance of the polymerization light to be applied to the imprint material during the overlap period is based on the deformation control information.

7. The method according to claim 4, wherein the overlap period is based on the deformation control information.

8. The method according to claim 4, wherein in the generating the polymerization control information, the polymerization control information is generated based on a value obtained in the shot region by averaging light amounts of the deformation light to be applied to the shot region during the overlap period.

9. The method according to claim 4, wherein the deformation control information includes information used to control at least one of an illuminance distribution, an irradiation area, and an irradiation time of the deformation light.

10. The method according to claim 4, wherein the deformation control information is information used to control a shape of the shot region so as to make an alignment error between the shot region and the pattern region fall within a target accuracy range, and the polymerization control information is information used to control irradiation of the polymerization light such that the viscosity of the imprint material reaches a target viscosity.

11. An imprint method of molding an imprint material on a shot region of a substrate using a mold, the method comprising:
    aligning the shot region and the mold in a state where the imprint material and a pattern region of the mold are in contact with each other; and
    curing the imprint material by irradiating the imprint material with curing light after the aligning,
    wherein the aligning is controlled so as to include an overlap period during which a period during which deformation light used to deform the shot region is applied to the substrate through the imprint material and a period during which polymerization light used to increase a viscosity of the imprint material is applied to the imprint material overlap each other, and
    the polymerization light to be applied to the imprint material is controlled in accordance with the deformation light to be applied to the imprint material during the overlap period, wherein
    the period during which the polymerization light is applied to the imprint material includes a period after the overlap period in addition to the overlap period, and
    in the period after the overlap period, a first irradiator applies the polymerization light to the imprint material, and in the overlap period, a second irradiator different from the first irradiator applies the polymerization light to the imprint material.

12. The method according to claim 11, wherein the deformation light is applied to the substrate by the second irradiator.

13. The method according to claim 11, wherein a wavelength band of the deformation light and a wavelength band of the polymerization light in the period after the overlap period are different from each other.

14. The method according to claim 11, wherein the curing light is applied to the imprint material by the first irradiator.

15. The method according to claim 14, wherein the polymerization light during the overlap period is applied to the imprint material through a first passing portion of a shutter plate provided in the first irradiator, and the curing light is applied to the imprint material through a second passing portion of the shutter plate.

16. The method according to claim 12, wherein the curing light is applied to the imprint material by the first irradiator.

17. The method according to claim 16, wherein the polymerization light during the overlap period is applied to the imprint material through a first passing portion of a shutter plate provided in the first irradiator, and the curing light is applied to the imprint material through a second passing portion of the shutter plate.

18. An article manufacturing method comprising:
forming a pattern on a substrate following an imprint method defined in claim 1; and
processing the substrate on which the pattern has been formed in the forming,
wherein an article is obtained from the substrate having undergone the processing.

\* \* \* \* \*